US011604692B2

(12) United States Patent
Shan et al.

(10) Patent No.: US 11,604,692 B2
(45) Date of Patent: Mar. 14, 2023

(54) FIELD PROGRAMMABLE GATE ARRAY (FPGA) WITH AUTOMATIC ERROR DETECTION AND CORRECTION FUNCTION FOR PROGRAMMABLE LOGIC MODULES

(71) Applicant: WUXI ESIONTECH CO., LTD., Wuxi (CN)

(72) Inventors: Yueer Shan, Wuxi (CN); Yanfeng Xu, Wuxi (CN); Jicong Fan, Wuxi (CN); Zhan Jing, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 0 days.

(21) Appl. No.: 17/457,440

(22) Filed: Dec. 3, 2021

(65) Prior Publication Data

US 2022/0091929 A1 Mar. 24, 2022

Related U.S. Application Data

(63) Continuation of application No. PCT/CN2021/128310, filed on Nov. 3, 2021.

(30) Foreign Application Priority Data

Aug. 19, 2021 (CN) .......................... 202110953116.7

(51) Int. Cl.
*G06F 11/10* (2006.01)
*H03K 19/17736* (2020.01)
*H03K 19/1776* (2020.01)

(52) U.S. Cl.
CPC ...... *G06F 11/1048* (2013.01); *G06F 11/1068* (2013.01); *H03K 19/1774* (2013.01); *H03K 19/1776* (2013.01)

(58) Field of Classification Search
CPC ............ G06F 11/1048; G06F 11/1068; H03K 19/1774; H03K 19/1776
See application file for complete search history.

(56) References Cited

U.S. PATENT DOCUMENTS 6,073,267 A * 6/2000 Sasaki ................. G06F 11/1008
714/799
7,143,329 B1 * 11/2006 Trimberger ...... H03K 19/17764
714/766

(Continued)

FOREIGN PATENT DOCUMENTS

CN 105760250 A 7/2016
CN 110727543 A 1/2020

(Continued)

*Primary Examiner* — Guy J Lamarre
(74) *Attorney, Agent, or Firm* — Bayramoglu Law Offices LLC

(57) ABSTRACT

A field programmable gate array (FPGA) with an automatic error detection and correction function for programmable logic modules includes an error checking and correction device. A check code generation circuit in the error checking and correction device performs error correcting code (ECC) encoding according to input data of corresponding programmable logic registers to generate a check code, and refreshes and writes the check code into a check code register according to a clock signal. A check circuit checks outputs of the programmable logic registers and check code registers to generate syndromes for implementing checking. A decoding circuit generates upset signals corresponding to the syndromes according to a trigger enable pulse of a trigger circuit to control a fault register to directly and asynchronously upset content to correct the error. A circuit area is greatly reduced by using the FPGA, thereby improving a degree of integration of the circuit.

12 Claims, 2 Drawing Sheets

(56) References Cited

U.S. PATENT DOCUMENTS

2003/0097628 A1      5/2003   Ngo et al.
2021/0311832 A1*    10/2021   Boschi .................. G06F 11/263

FOREIGN PATENT DOCUMENTS

| CN | 111143107 A | 5/2020 |
| CN | 111176884 A | 5/2020 |
| CN | 111597073 A | 8/2020 |

\* cited by examiner

FIELD PROGRAMMABLE GATE ARRAY (FPGA) WITH AUTOMATIC ERROR DETECTION AND CORRECTION FUNCTION FOR PROGRAMMABLE LOGIC MODULES

CROSS REFERENCE TO THE RELATED APPLICATIONS

This application is the continuation application of International Application No. PCT/CN2021/128310, filed on Nov. 3, 2021, which is based upon and claims priority to Chinese Patent Application No. 202110953116.7, filed on Aug. 19, 2021, the entire contents of which are incorporated herein by reference.

TECHNICAL FIELD

The present invention relates to the field of field programmable gate array (FPGA) technologies, and more particularly, to an FPGA with an automatic error detection and correction function for programmable logic modules.

BACKGROUND

With the development of very large scale integration circuits, FPGA chips as a key device have been used more widely in the aerospace engineering due to excellent interface performance, rich logics and IP resources as well as a flexible and convenient field programmable capability.

The FPGA chip applied in the aerospace engineering generally requires relatively high reliability. However, a spatial energetic particle in a space radiation environment easily leads to a single event upset (SEU) problem, resulting in the failure of a circuit function. Therefore, currently, error correction is generally performed on a configuration random access memory (CRAM) in the FPGA chip through triple module redundant (TMR) in combination with off-chip refresh, so as to improve the reliability. All data shift registers (DSR) and address shift registers (ASR) in a memory are designed and configured by using the TMR method, i.e., one register is copied into three registers, and when any register is upset and has an error, and other two registers perform output normally, so that correct content of the register can be still ensured in a 2-out-of-3 decision-making manner. When an error occurs, a configuration bitstream is rewritten for error correction.

However, the existing method is usually designed only for the reliability of the register in the configuration memory, and the protection effect is limited. In addition, a relatively large circuit area is required for the TMR method, which is not conducive to a degree of integration of the FPGA chip.

SUMMARY

In view of the problem and technical requirements, the inventor proposes an FPGA with an automatic error detection and correction function for programmable logic modules, and a technical solution of the present invention is as follows.

An FPGA with an automatic error detection and correction function for programmable logic modules is provided, the FPGA including a programmable logic module and an error checking and correction device, where the programmable logic module includes a plurality of programmable logic registers, and each programmable logic register refreshes and writes obtained input data according to a clock signal; and the error checking and correction device includes a check code generation circuit, M check code registers, a check circuit, a decoding circuit, and a trigger circuit;

N input terminals of the check code generation circuit are respectively connected to corresponding input terminals of N programmable logic registers to obtain N pieces of input data; M output terminals of the check code generation circuit are respectively connected to the M check code registers; the check code generation circuit performs error correcting code (ECC) encoding on the N pieces of input data to generate M check codes, and each check code register refreshes and writes a corresponding check code according to a clock signal of programmable logic registers corresponding to the error checking and correction device;

output terminals of the N programmable logic registers and output terminals of the M check code registers are all connected to input terminals of the check circuit; output terminals of the check circuit are connected to input terminals of the decoding circuit to provide syndromes, and the syndromes are used for indicating that a fault register with a data error exists in the N+M registers; and the trigger circuit is connected to an enable terminal of the decoding circuit; the decoding circuit generates N+M upset signals that have a predetermined pulse width and correspond to the syndromes according to trigger enable pulses of the trigger circuit, and respectively outputs the N+M upset signals to the N programmable logic registers and the M check code registers to control the fault register to directly and asynchronously upset content to correct the error.

Further, when the programmable logic registers corresponding to the error checking and correction device refresh and write obtained input data according to the clock signal, the trigger circuit controls the decoding circuit to be in an invalid state for a predetermined duration.

Further, the predetermined duration for which the decoding circuit is in the invalid state is greater than a delay from a moment when the input terminals of the check circuit obtain data to a moment when the output terminals of the decoding circuit generate signals.

Further, an invalid duration is greater than a pulse width of an upset signal.

Further, the trigger enable pulses output by the trigger circuit are separated at least by a predetermined waiting duration, and the predetermined waiting duration is greater than a duration for the error checking and correction device to update the upset signals according to corrected data.

Further, the error checking and correction device further includes a timer, and an interval between the trigger enable pulses output by the trigger circuit is controlled by using the timer.

Further, N programmable logic registers corresponding to one error checking and correction device are included in the same programmable logic module or are included in at least two different programmable logic modules.

Further, N programmable logic registers corresponding to one error checking and correction device are controlled by the same clock signal;

or, N programmable logic registers corresponding to one error checking and correction device are controlled by at least two different clock signals, and checking corrector works according to all the clock signals.

Further, all the N programmable logic registers corresponding to one error checking and correction device are configured to implement a design of a user, or some programmable logic registers are configured to implement a design of a user, and input data of programmable logic registers that are not configured to implement the design of the user are constantly at an invalid level.

Further, input data of programmable logic registers configured to implement a design of a user is from the inside and/or the outside of the programmable logic module to which the programmable logic registers belong, and input data from the inside of the programmable logic module is generated from at least one of a look-up table, a carry chain, a data selector, and a trigger.

Further, the check code generation circuit performs ECC encoding by using a Hamming code, and values of M and N meet an encoding rule of the Hamming code with a corresponding quantity of bits.

Further, when the FPGA does not enter a normal working mode in case that the FPGA has not been powered on, or bitstream configuration is not completed, or initialization is not completed, the error checking and correction device is in an invalid state; and after the FPGA enters the normal working mode, the error checking and correction device performs error checking and correction.

The present invention has the following advantages:

This application discloses an FPGA with an automatic error detection and correction function for programmable logic modules. Error detection and correction is performed on programmable logics for programmable logic registers in a programmable logic module by using an error checking and correction device, during normal operation of the FPGA, the programmable logic registers are updated in real time according to a clock signal, and the error checking and correction device may perform real-time error detection and correction, to ensure correct content of the programmable logic registers. Such an error detection and correction function of the FPGA is more perfect and has higher reliability, and compared with a TMR method, a circuit area is greatly reduced by using this method, thereby improving a degree of integration of the circuit.

DETAILED DESCRIPTION OF THE EMBODIMENTS

The specific embodiments of the present invention will be further described with reference to the accompanying drawings.

This application discloses an FPGA with an automatic error detection and correction function for programmable logic modules. The FPGA includes conventional programmable logic resources, and the programmable logic resources inside the PFGA mainly include a programmable resource and an interconnection resource. The programmable resource includes a programmable logic module (CLB), a block random access memory (BRAM), an input/output block (IOB), a digital signal processor (DSP), a personal computer (PC), and the like, and the interconnection resource includes a wiring box, an interconnection line, and the like. Each programmable logic module CLB includes a plurality of programmable logic registers and generally further includes a look-up table (LUT), a carry chain, a data selector, a trigger, and the like.

In addition to including the conventional programmable logic resources, a dedicated error checking and correction device corresponding to the programmable logic module (CLB) is further designed for the FPGA of this application, i.e., the FPGA further includes an additional hardware resource. The error checking and correction device is a hardware resource implemented and made based on a conventional circuit component, so that the error checking and correction device may be implemented by using a conventional FPGA manufacturing process.

Figure 1:
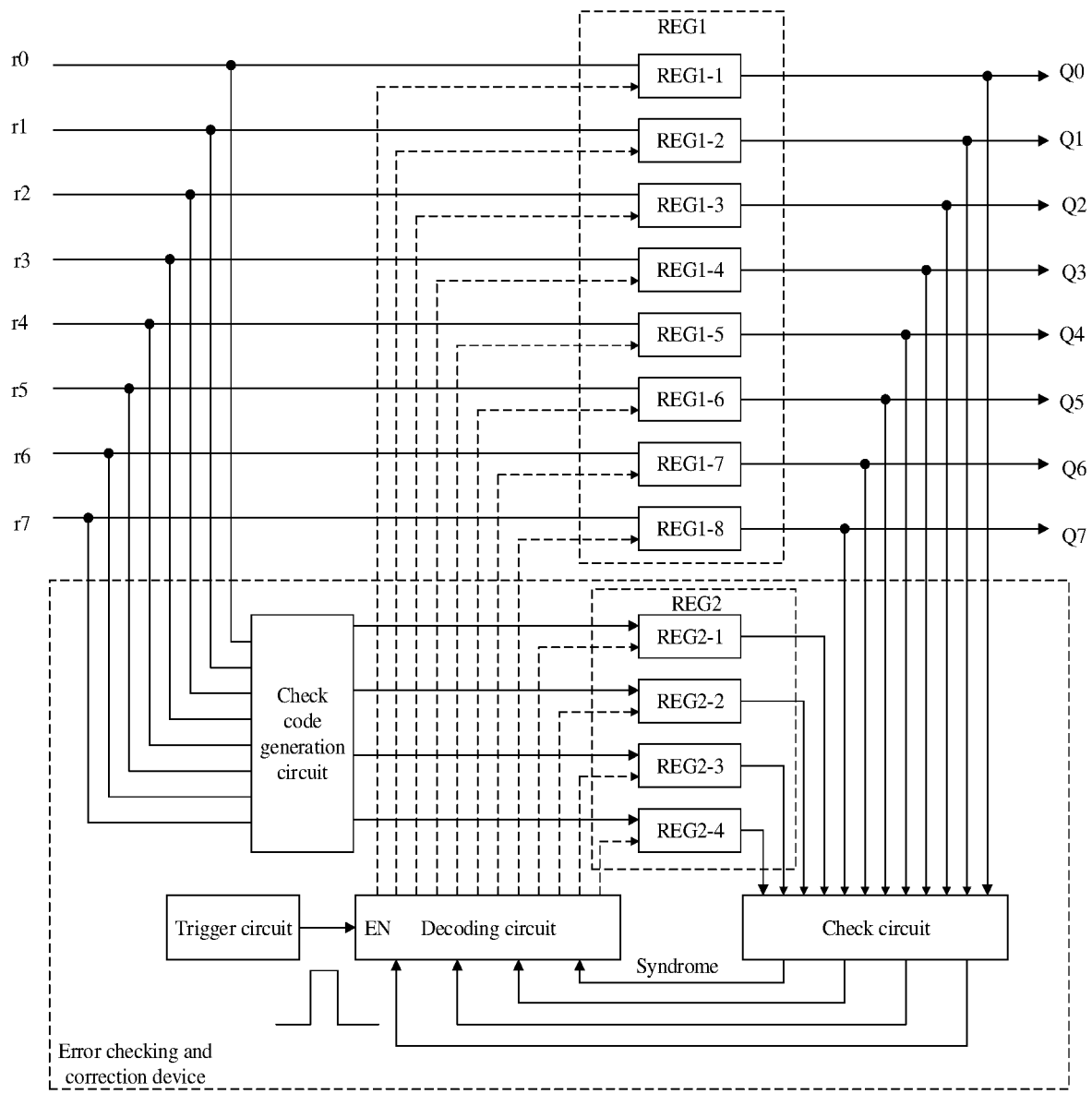
FIG. 1 is a schematic diagram of a connection between an error checking and correction device and corresponding N programmable logic registers according to this application.

As shown in FIG. 1, the error checking and correction device includes a check code generation circuit, M check code registers REG2, a check circuit, a decoding circuit, and a trigger circuit. In FIG. 1, for example, M=4. N input terminals of the check code generation circuit are respectively connected to corresponding input terminals of N programmable logic registers REG1. In FIG. 1, for example, N=8. M output terminals of the check code generation circuit are respectively connected to the M check code registers, output terminals of the N programmable logic registers and output terminals of the M check code registers are all connected to input terminals of the check circuit, and output terminals of the check circuit are connected to input terminals of the decoding circuit. The trigger circuit is connected to an enable terminal of the decoding circuit, and output terminals of the decoding circuit are connected to the N programmable logic registers and the M check code registers.

The error checking and correction device corresponds to the N programmable logic registers and also corresponds to the programmable logic module to which the N programmable logic registers belong. In an embodiment, if the N programmable logic registers corresponding to one error checking and correction device are included in the same programmable logic module, one error checking and correction device corresponds to one programmable logic module. In another embodiment, if the N programmable logic registers corresponding to one error checking and correction device are included in at least two different programmable logic modules, one error checking and correction device corresponds to a plurality of different programmable logic modules, i.e., the plurality of programmable logic modules may share one error checking and correction device, to reduce a circuit area and reduce additional costs caused by an error correction function. In another aspect, programmable logic registers inside one programmable logic module correspond to one error checking and correction device or correspond to a plurality of error checking and correction devices.

During operation of the FPGA, the N programmable logic registers corresponding to the error checking and correction device refresh and write data according to a conventional working process of the programmable logic registers inside the programmable logic module. To be specific, the N programmable logic registers corresponding to the error checking and correction device respectively obtain corresponding input signals from the input terminals, and then refresh and write the obtained input data according to a clock signal (CLK). The refreshing and writing according to the clock signal CLK according to an actual configuration generally refers to that the input data is written into the programmable logic registers at a rising edge or a falling edge of the clock signal and remains until the input data is covered by new input data at a next clock cycle.

The input data of the N programmable logic registers corresponding to the error checking and correction device is sent to the error checking and correction device, and is specifically sent to the input terminals of the check code generation circuit. After obtaining N pieces of input data, the N input terminals of the check code generation circuit perform ECC encoding on the N pieces of input data, to generate M check codes. Values of M and N meet an encoding rule of ECC encoding. In an embodiment, the check code generation circuit performs ECC encoding by using a Hamming code, and the values of M and N meet an encoding rule of the Hamming code with a corresponding quantity of bits. For example, commonly, M=8 and N=4, meeting the encoding rule of the Hamming code (8, 4). In another example, N=4 and M=3, meeting the encoding rule of the Hamming code (4, 3). In another example, N=16 and M=5, meeting the encoding rule of the Hamming code (16, 5). Because a plurality of CLBs may share one error checking and correction device, an actual effect may be that, for example, one CLB uses one error checking and correction device that performs (8, 4) encoding, two CLBs share one error checking and correction device that performs (8+8, 5) encoding, and four CLBs share one error checking and correction device that performs (8+8+8+8, 6) encoding.

Each check code register refreshes and writes a corresponding check code according to the clock signal of the programmable logic registers corresponding to the error checking and correction device. The meaning of refreshing and writing the check code by the check code register is similar to that of the programmable logic register, i.e., the check code is refreshed and written at the rising edge or the falling edge of the clock signal. Therefore, the input data and the check code are synchronously stored in the programmable logic register and the check code register respectively.

Signals at the output terminals of the N programmable logic registers and signals at the output terminals of the M check code registers form N+M bits of codes in total and the N+M bits of codes are transmitted to the check circuit. The check circuit matching ECC encoding is used, for example, a parity circuit is generally used for the check circuit based on the Hamming code. The check circuit generates syndromes according to the obtained N+M bits of codes. The syndromes are used for indicating that a fault register with a data error exists in the N+M registers, and the fault register may be the programmable logic register or may be the check code register, thereby achieving an error checking and correction function. It should be noted that FIG. 1 shows only a connection relationship between circuits but does not indicate an arrangement sequence of the N+M bits of codes, and a sequence of codes in the N+M bits of codes is determined according to an encoding rule.

The decoding circuit may decode the syndromes to obtain N+M bits of decoding results, each bit of decoding result corresponds to one register in the N+M registers, and one bit of decoding result corresponding to the fault register is at an valid level and the remaining bits of decoding results are all at an invalid level. Typically, the invalid level is 0 and the valid level is 1, so that the fault register may be upset by using the valid level. Because the N+M bits of decoding results are used for upsetting the fault register, due to a circuit, a waveform of a decoded signal is controlled by using the trigger circuit at the enable terminal, and the N+M bits of decoding results are processed into a pulse form. The trigger circuit may be a common one-shot circuit and is 0 by default when being disabled. In this case, the decoding circuit outputs an invalid level, i.e., all the registers are not upset. When being enabled, the trigger circuit outputs a trigger enable pulse with a predetermined pulse width to enable the decoding circuit, so that the decoding circuit outputs N+M upset signals that have a predetermined pulse width and correspond to the syndromes. One upset signal corresponding to the fault register outputs an valid level with a predetermined pulse width, and the remaining upset signals continuously output invalid levels, to control the fault register in the N+M registers to directly and asynchronously upset content to correct the error without waiting for the clock signal, thereby implementing error correction of the fault register. Therefore, in this application, when error correction is performed on the fault register, the content that is corrected and updated is different from the data written according to the clock signal and is not rewritten and refreshed directly. The trigger enable pulses output by the trigger circuit are separated at least by a predetermined waiting duration, and the predetermined waiting duration is greater than a duration for the error checking and correction device to update the upset signals according to corrected data, so that there may be a time for transmitting the data obtained after error correction is performed on the fault register to the error checking and correction device for error checking and correction again, thereby avoiding continuous error correction caused by continuous pulses. A typical method may include performing control by using a timer. The error checking and correction device further includes the timer, and an interval between the trigger enable pulses output by the trigger circuit is controlled by using the timer.

In the process, the error checking and correction device needs to further avoid a conflict with normally written input data within a clock cycle, so that when the programmable logic registers corresponding to the error checking and correction device refresh and write the obtained input data according to the clock signal, the trigger circuit controls the decoding circuit to be in an invalid state for a predetermined duration, to avoid a conflict between the upset signal and the data written according to the clock signal. In an embodiment, the predetermined duration for which the decoding circuit is in the invalid state is greater than a delay from a moment when the input terminals of the check circuit obtain data to a moment when the output terminals of the decoding circuit generate signals, i.e., it is necessary to wait until an output of the error checking and correction device is stable. Because the decoding result is scrambled and cannot be used for controlling the register when the output of the decoding circuit is unstable, it is necessary to wait until the output of the error checking and correction device is stable, i.e., the output of the decoding circuit is stable. In another embodiment, the duration for which the decoding circuit is in the invalid state is greater than the pulse width of the upset signal, to completely avoid the conflict.

As described above, in a working process of the error checking and correction device, the check code register needs to refresh and write data according to a clock signal of the programmable logic registers, and the trigger circuit further needs to controls the decoding circuit to be in an invalid state according to the clock signal to avoid a conflict. Therefore, the error checking and correction device works according to the clock signal of the N programmable logic registers corresponding to the error checking and correction device. In an embodiment, if the N programmable logic registers corresponding to one error checking and correction device are controlled by the same clock signal, the error checking and correction device works according to one clock signal. In another embodiment, if the N programmable logic registers corresponding to one error checking and correction device are controlled by at least two different clock signals, the error checking and correction device works according to all the clock signals. For example, in the N programmable logic registers, if N1 programmable logic registers are controlled by a CLK1 and N2 programmable logic registers are controlled by a CLK2, the check code registers and the N1 programmable logic registers perform refresh and writing according to the CLK2 together. Similarly, the trigger circuit controls the decoding circuit to be in the invalid state when the N1 programmable logic registers write data according to the CLK1, and the trigger circuit also controls the decoding circuit to be in the invalid state when the N2 programmable logic registers write data according to the CLK2.

During application of the method, all the N programmable logic registers corresponding to one error checking and correction device are configured to implement a design of a user, or some programmable logic registers are configured to implement a design of a user, and input data of programmable logic registers that are not configured to implement the design of the user are constantly at an invalid level, i.e., approaching 0 and does not affect the error detection and correction process.

Figure 2:
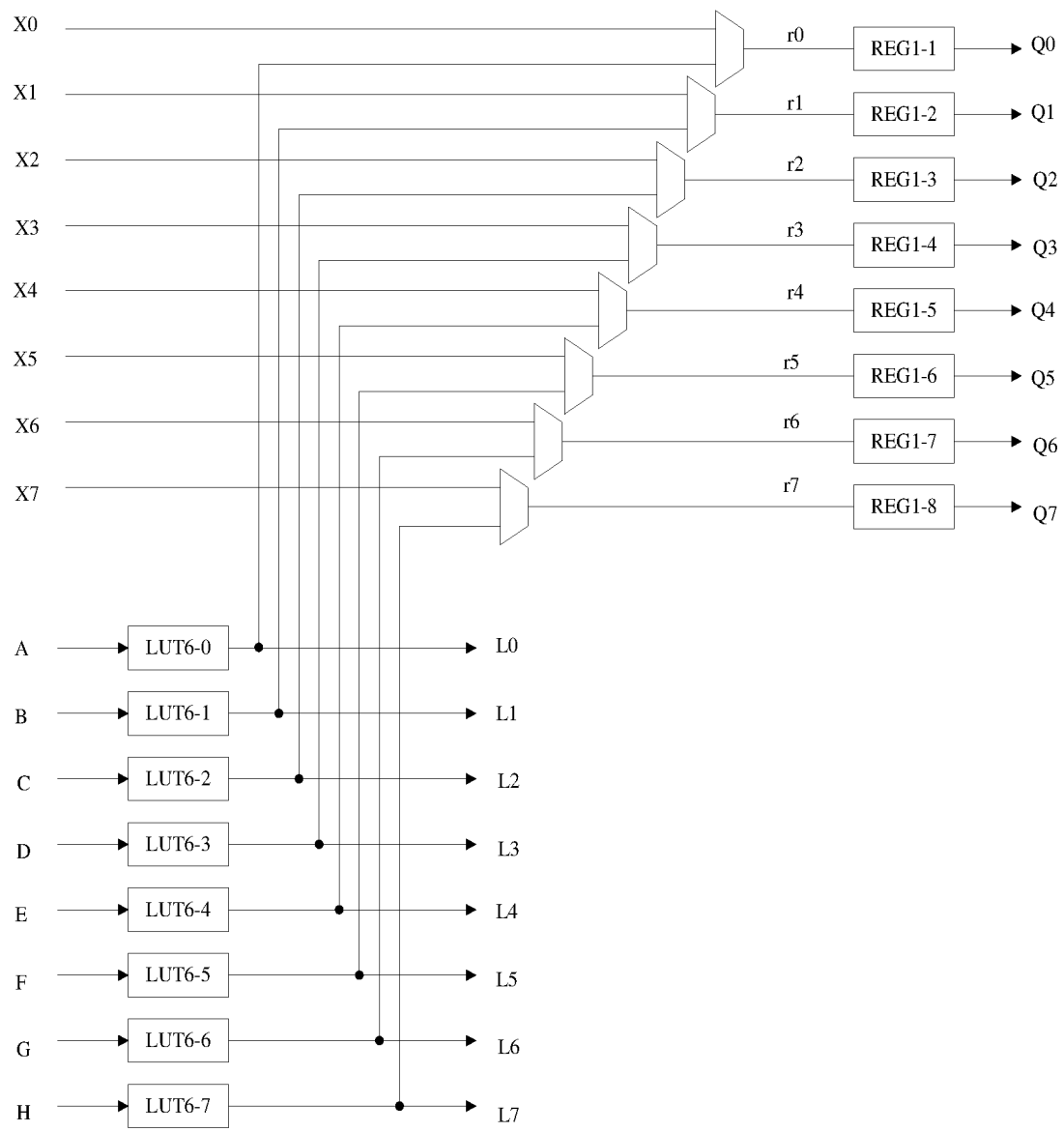
FIG. 2 is a schematic diagram of a source of input data of N programmable logic registers corresponding to an error checking and correction device in an embodiment.

Input data of programmable logic registers configured to implement the design of the user is from the inside and/or the outside of the programmable logic module to which the programmable logic registers belong, and input data from the inside of the programmable logic module is generated from at least one of a look-up table, a carry chain, a data selector, and a trigger. Sources of the input data of the N programmable logic registers may be identical or may be different, i.e., input data of some programmable logic registers is from outside the programmable logic module, input data of some programmable logic registers is from an internal LUT, input data of some programmable logic registers is from another LUT, input data of some programmable logic registers is from an internal carry chain, and the like. In an embodiment, if input data of one programmable logic register is from outside the programmable logic module or the LUT, an input terminal of the programmable logic register is connected to a module input port of the programmable logic module and an output of the LUT and selects one path of input data according to a configuration bit. As shown in FIG. 2, eight programmable logic registers are all located in the same programmable logic module, the programmable logic module has eight input LUT6s LUT6-0 to LUT6-7, inputs of the LUTs are respectively eight groups of signals A, B, C, D, E, F, G, and H in total, a width of each group of signal is six bits, and outputs of the LUTs are respectively L0 to L7. Input data r0 to r7 of the eight programmable logic registers is from inputs X0 to X7 of the module input port and the outputs L0 to L7 of the LUTs, and the inputs of the programmable logic registers may be respectively selected independently through the configuration bit.

In an actual application, when the FPGA does not enter a normal working mode in case that the FPGA has not been powered on, or bitstream configuration is not completed, or initialization is not completed, the error checking and correction device is in an invalid state. After the FPGA enters the normal working mode, the error checking and correction device starts working and performs error checking and correction according to the described method.

In an embodiment, the error checking and correction device corresponds to eight programmable logic registers. The check code generation circuit generates four check codes p1,p2,p4,p8 for input data r0,r1,r2,r3,r4,r5,r6,r7 of the eight programmable logic registers based on the (8, 4) Hamming code, eight pieces of input data and the four check codes form 12 bits of codes, which are recorded as {c1,c2, c3,c4,c5,c6,c7,c8,c9,c10,c11,c12}, and a forming manner is {p1,p2,r0,p4,r1,r2,r3,p8,r4,r5,r6,r7}, i.e., c1=p1, c2=p2, c3=r0, c4=p4, c5=r1, c6=r2, c7=r3, c8=p8, c9=r4, c10=r5, c11=r6, and c12=r7. During encoding, a method for generating the four check codes includes: selecting p1, to cause a result of XOR(c1,c3,c5,c7,c9,c11) to be 0 (an even number), i.e., p1=c1=XOR(c3,c5,c7,c9,c11); selecting p2, to cause a result of OR (c2,c3,c6,c7,c10,c11) to be 0 (an even number), i.e., p2=c2=XOR(c3,c6,c7,c10,c11); selecting p4, to cause a result of XOR(c4,c5,c6,c7,c12) to be 0 (an even number), i.e., p4=c4=XOR(c5,c6,c7,c12); and selecting p8, to cause a result of XOR(c8,c9,c10,c11,c12) to be 0 (an even number), i.e., p8=c8=XOR(c9,c10,c11,c12). The 12 bits of codes are written into the registers under control of a clock signal.

During error checking and correction, the written 12 bits of codes {c1,c2,c3,c4,c5,c6,c7,c8,c9,c10,c11,c12}, outputs Q0,Q1,Q2,Q3,Q4,Q5,Q6,Q7 of the programmable logic registers, and outputs P1,P2,P4,P8 of the check code registers are detected, and a forming manner is {P1,P2,Q0,P4, Q1,Q2,Q3,P8,Q4,Q5,Q6,Q7}, i.e., c1=P1, c2=P2, c3=Q0, c4=P4, c5=Q1, c6=Q2, c7=Q3, c8=P8, c9=Q4, c10=Q5, c11=Q6, c12=Q7. In this case, P8,P4,P2,P1 may be considered as syndromes. If the four bits are all 0, it indicates all content is correct, otherwise, the four bits of signals indicate that a fault register with a data error exists. For example, if P8,P4,P2,P1=0110, it indicates a register corresponding to c6 has an error and is the fault register.

The syndromes P8,P4,P2,P1 are input into a decoder of 4 to 12 bits, and the decoder generates upset signals of {f0,f1,f2,f3,f4,f5,f6,f7,f8,f9,f10,f11} under action of a trigger enable pulse. Only one bit of upset signal corresponding to the fault register is at a high level, and the remaining upset signals are all 0. In the foregoing example, if c6 corresponds to the fault register, only f6 corresponding to an output upset signal is 1, and the remaining are 0, and the output upset signal is {0,0,0,0,0,0,1,0,0,0,0,0}.

What is claimed is:

1. A field programmable gate array (FPGA) with an automatic error detection and correction function for programmable logic modules, comprising a programmable logic module and an error checking and correction device, wherein the programmable logic module comprises a plurality of programmable logic registers, and each programmable logic register of the plurality of programmable logic registers refreshes and writes obtained input data according to a clock signal;

the error checking and correction device comprises a check code generation circuit, M check code registers, a check circuit, a decoding circuit, and a trigger circuit;

N input terminals of the check code generation circuit are respectively connected to corresponding input terminals of N programmable logic registers to obtain N pieces of input data; M output terminals of the check code generation circuit are respectively connected to the M check code registers; the check code generation circuit performs error correcting code (ECC) encoding on the N pieces of input data to generate M check codes, and each check code register of the M check code registers refreshes and writes a corresponding check code according to a clock signal of programmable logic registers corresponding to the error checking and correction device;

output terminals of the N programmable logic registers and output terminals of the M check code registers are all connected to input terminals of the check circuit; output terminals of the check circuit are connected to input terminals of the decoding circuit to provide syndromes, and the syndromes are used for indicating that a fault register with a data error exists in the N+M registers; and the trigger circuit is connected to an enable terminal of the decoding circuit; the decoding circuit generates N+M upset signals that have a predetermined pulse width and correspond to the syndromes according to trigger enable pulses of the trigger circuit, and respectively outputs the N+M upset signals to the N programmable logic registers and the M check code registers to control the fault register to directly and asynchronously upset content to correct the data error.

2. The FPGA according to claim 1, wherein when the programmable logic registers corresponding to the error checking and correction device refresh and write obtained input data according to the clock signal, the trigger circuit controls the decoding circuit to be in an invalid state for a predetermined duration.

3. The FPGA according to claim 2, wherein the predetermined duration is greater than a delay from a moment when the input terminals of the check circuit obtain data to a moment when the output terminals of the decoding circuit generate signals, wherein the decoding circuit is in the invalid state for the predetermined duration.

4. The FPGA according to claim 2, wherein an invalid duration is greater than a pulse width of an upset signal.

5. The FPGA according to claim 1, wherein the trigger enable pulses output by the trigger circuit are separated at least by a predetermined waiting duration, and the predetermined waiting duration is greater than a duration for the error checking and correction device to update the N+M upset signals according to corrected data.

6. The FPGA according to claim 5, wherein the error checking and correction device further comprises a timer, and an interval between the trigger enable pulses output by the trigger circuit is controlled by using the timer.

7. The FPGA according to claim 1, wherein

N programmable logic registers corresponding to one error checking and correction device are comprised in a same programmable logic module or are comprised in at least two different programmable logic modules.

8. The FPGA according to claim 1, wherein

N programmable logic registers corresponding to one error checking and correction device are controlled by a same clock signal;

or, N programmable logic registers corresponding to one error checking and correction device are controlled by at least two different clock signals, and the error checking and correction device works according to the at least two different clock signals.

9. The FPGA according to claim 1, wherein all the N programmable logic registers corresponding to one error checking and correction device are configured to implement a design of a user, or some programmable logic registers are configured to implement a design of a user, and input data of programmable logic registers that are not configured to implement the design of the user are constantly at an invalid level.

10. The FPGA according to claim 1, wherein input data of programmable logic registers configured to implement a design of a user is from an inside and/or an outside of the programmable logic module to which the programmable logic registers belong, and input data from the inside of the programmable logic module is generated from at least one selected from the group consisting of a look-up table, a carry chain, a data selector, and a trigger.

11. The FPGA according to claim 1, wherein the check code generation circuit performs ECC encoding by using a Hamming code, and values of M and N meet an encoding rule of the Hamming code with a corresponding quantity of bits.

12. The FPGA according to claim 1, wherein when the FPGA does not enter a normal working mode in case that the FPGA has not been powered on, or bitstream configuration is not completed, or initialization is not completed, the error checking and correction device is in an invalid state; and after the FPGA enters the normal working mode, the error checking and correction device performs error checking and correction.

* * * * *